Feb. 18, 1969 JAMES E. WEBB 3,428,910
ADMINISTRATOR OF THE NATIONAL AERONAUTICS
AND SPACE ADMINISTRATION
AUTOMATIC GAIN CONTROL SYSTEM
Filed Dec. 23, 1965

Stanley H. Black
INVENTOR.
BY G. T. McCoy
Harvey S. Hertz
ATTORNEYS 3,428,910
Patented Feb. 18, 1969

3,428,910

AUTOMATIC GAIN CONTROL SYSTEM

James E. Webb, Administrator of the National Aeronautics and Space Administration with respect to an invention of Stanley H. Black, Phoenix, Ariz.

Filed Dec. 23, 1965, Ser. No. 516,154
U.S. Cl. 330—29 3 Claims
Int. Cl. H03g *3/30;* H03f *1/30*

ABSTRACT OF THE DISCLOSURE

An automatic gain control system for attenuating input signals over a wide range of signal levels to prevent overloading the output stage of a receiver system. R.F. input signals are coupled to a diode network attenuator, the output of which is coupled to a reflex amplifier. A D.C. control voltage proportional to the signal amplitude in the last amplifier of the receiver in which AGC system is to be used is coupled to a D.C. input terminal of the reflex amplifier. The D.C. output voltage of the reflex amplifier is applied through an L-C network to an AGC control amplifier, the output of which is coupled to a control terminal of the attenuator for varying the attenuation level of the attenuator network. The R.F. output signal is taken from R.F. output terminal of the reflex amplifier. As the amplified D.C. control voltage is varied, the system operates to keep the R.F. output voltage of the last stage relatively constant by causing more or less attenuation to be inserted by the electrically controlled attenuator.

Figure 1:
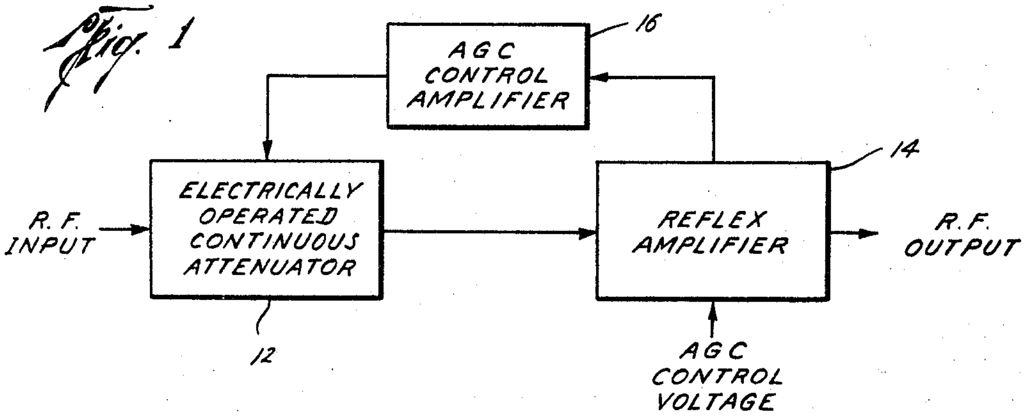

The invention described herein was made in the performance of work under a NASA contract and is subject to the provisions of Section 305 of the National Aeronautics and Space Act of 1958, Public Law 85–568 (72 Stat. 435; USC 2457).

The invention relates in general to automatic gain control systems and, more particularly, to a system for providing a relatively constant output signal level using an electrically controlled attenuator.

In a receiver system which must be able to handle a wide range of input signal levels, a form of automatic gain control must be employed to prevent overload of the final output stage. Heretofore, a conventional type of automatic gain control system utilized a diode detector to develop a unidirectional control voltage whose amplitude was proportional to the receiver system output level. This unidirectional control voltage was fed back to one or more earlier stages of the receiver system so as to reduce the gain of these earlier stages, thus causing the output level to remain substantially constant. When extremely large input signals were present, however, distortion in the gain control stage of the automatic gain control system caused reduced handling capability. Utilizing presently available transistors, the maximum undistorted input signal was limited to no more than 10 to 50 millivolts, R.M.S.

In order to overcome the attendant disadvantages of prior art automatic gain control systems and to provide an automatic gain control system, which is capable of handling input signals in the order of 1,000 millivolts R.M.S., the system of the present invention utilizes an electrically operated continuous attenuator, which is controlled by an automatic gain control amplifier. Input radio-frequency (R.F.) signals are fed into the attenuator. The attenuated R.F. signal is fed into a reflex amplifier together with a direct current (D.C.) control voltage from the output stage of a receiver system. The reflex amplifier amplifies the attenuated input R.F. signal and feeds it to the next stage of the receiver system. The D.C. control voltage is fed into an automatic gain control (AGC) amplifier. The output of the AGC control amplifier is used to vary the amount of attenuation of the electrically operated continuous amplifier.

More particularly, according to a preferred embodiment of the invention, input R.F. signals are fed into the electrically operated continuous attenuator formed of three diodes, whose cathodes are joined together and connected through a resistor to ground. The anodes of the first and second diode are biased by means of a D.C. control voltage, which are coupled thereto through an inductor. The R.F. signal is coupled to the anode of the first diode and the attenuated R.F. signal is taken off the anode of the second diode and coupled through a coupling capacitor to the base of a transistor of the reflex amplifier. The AGC control voltage is also connected to the base of the reflex amplifier transistor through an input L-C network. The AGC control voltage and the R.F. signal are amplified by the reflex amplifier and the R.F. output is taken off of an inductance in an output L-C network connected to the collector of the reflex amplifier transistor. Further, the AGC control voltage is fed back through the output L-C network to the base of an AGC control amplifier transistor. The collector of the control amplifier transistor is connected to the anode of the third diode of the electrically operated attenuator. As the amplified D.C. control voltage is varied, the attenuation is varied thus causing the input R.F. signal to the attenuator to be corrected.

Figure 2:
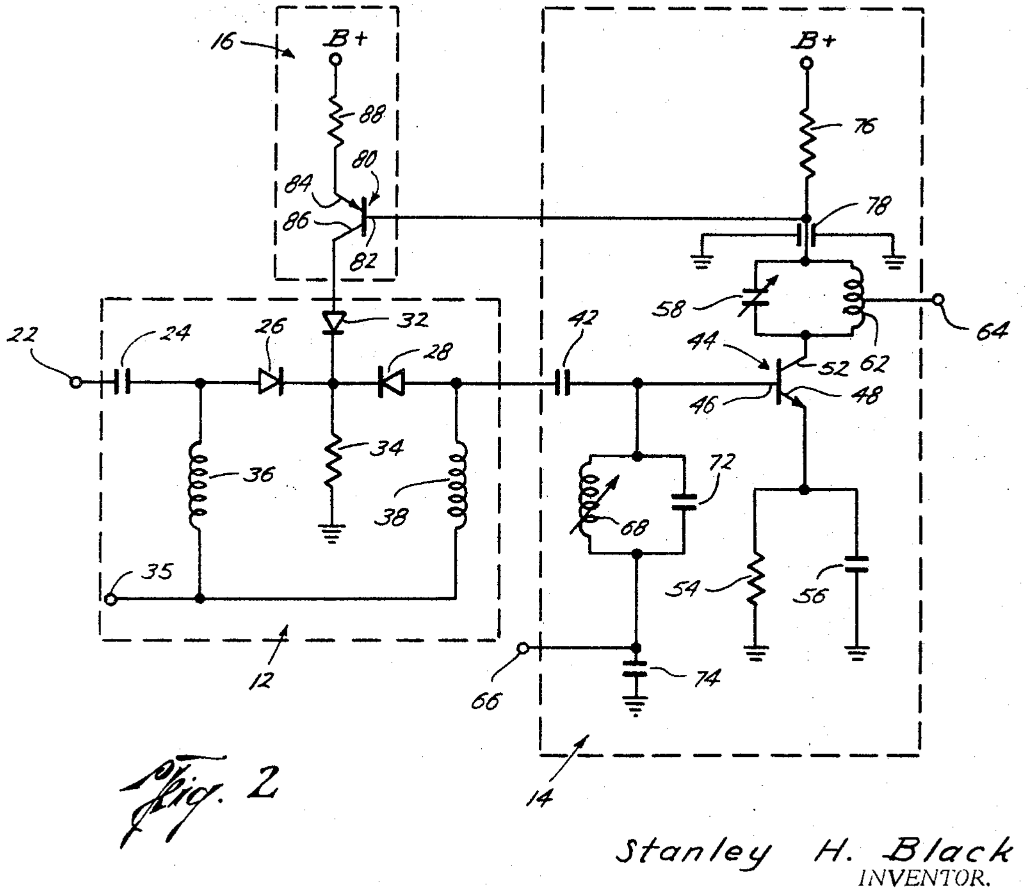

The advantage of this invention, both as to its construction and mode of operation, will be readily appreciated as the same become better understood by reference to the following detailed description when considered in connection with the accompanying drawings in which like reference numerals designate like parts throughout the figures, and wherein:

FIG. 1 is a block diagram of the automatic gain control system of this invention; and FIG. 2 is a circuit diagram of a preferred embodiment of the block diagram system of FIG. 1.

Referring now to the drawings, there is shown in FIG. 1 a block diagram of the automatic gain control system wherein R.F. input signals, which are to be controlled, are coupled to the input terminal of an electrically operated continuous attenuator 12. The output of the attenuator is fed to the R.F. input terminal of a reflex amplifier 14. A unidirectional AGC control voltage, proportional to the amplitude of the signal present in the last amplifier of a receiver system in which the automatic gain control system is to be utilized, is fed into the D.C. input terminal of the reflex amplifier 14. The R.F. output signal is taken from the R.F. output terminal of the reflex amplifier. The amplified D.C. signal is coupled from the D.C. output terminal of the reflex amplifier to an AGC control amplifier 16. The amplified D.C. control voltage is fed from the control amplifier 16 back to the attenuator 12. The system operates in such a manner as to keep R.F. output voltage of the last stage relative constant by causing more or less attenuation to be inserted by the electrically operated continuous attenuator 12.

Referring now to FIG. 2, there is shown a preferred embodiment of a circuit utilized in the automatic gain control system of FIG. 1. R.F. input signals, which are to be controlled, are applied to an input terminal 22 which is coupled to one side of a coupling capacitor 24 of the electrically operated continuous attenuator 12. The electrically operated continuous attenuator is formed of a first diode 26, a second diode 28, and a third diode 32. The other side of the capacitor 24 is coupled to the anode of diode 26. The cathodes of each of the diodes are coupled through a resistor 34 to ground. The diodes 26 and 28 are biased by means of a positive D.C. control voltage connected to a terminal 35. The terminal 35 is coupled to the anodes of diodes 26 and 28 through a pair of inductors 36, 38, respectively, which form R.F. chokes.

The attenuated R.F. signal is coupled from the anode of diode 28 to one side of a coupling capacitor 42. The other side of the capacitor 42 is connected to a transistor 44 of the reflex amplifier 14 at the base 46 of the transistor 44. The transistor 44 further comprises an emitter 48 and a collector 52. The emitter 48 is coupled to ground through a first path comprising a biasing resistor 54 and a second path comprising an R.F. by-pass capacitor 56. The collector 52 of the transistor 44 is connected to one side of an output L-C circuit formed of a capacitor 58 and an inductor 62 connected in parallel. Output R.F. signals are taken off of a terminal 64, which is connected to the inductor 62.

Input AGC control voltage to the reflex amplifier are coupled from a terminal 66 to the base 46 of transistor 44 through an input L-C circuit formed by an inductor 68 and a capacitor 72 connected in parallel. The terminal 66 is further connected through an R.F. shunting capacitor 74 to ground.

The other side of the output L-C circuit is connected to a source of positive reference voltage through a D.C. output resistor 76. Further, a feed-through capacitor 78 is connected to the lead at the other side of the output L-C circuit so as to prevent R.F. signals from passing to the resistor 76. The junction of the output L-C circuit and the resistor 76 is connected to a control transistor 80 of the AGC control amplifier 16 at a base 82 of the transistor 80. The control transistor 80 further comprises an emitter 84 and a collector 86. The emitter 84 is connected through a biasing resistor 88 to a source of positive reference voltage and the collector 86 is connected to the anode of the third diode 32.

With the foregoing in mind, operation of the circuit of FIG. 2 is as follows:

In the no-signal condition, the AGC control voltage applied to the terminal 66 is of such value as to allow only a small amount of current to flow in the collector circuit of transistor 44. The resulting voltage drop across the D.C. output resistor 76 is, therefore, not sufficient to turn on control transistor 80. Thus, the diode 32 is effectively an open circuit. In addition, a positive bias voltage is applied to the terminal 35, forward-biasing the diode 26 and the diode 28. This causes a current flow through both diodes 26 and 28 through the resistor 34. Therefore, it can be seen that in the no-signal condition, diodes 26 and 28 are turned on while diode 32 is effectively turned off, resulting in minimum attenuation.

When an input R.F. signal is applied to the terminal 22 and coupled to the attenuator 12 at the anode of diode 26, the attenuated R.F. signal is coupled from the anode of diode 28 to the base 46 of transistor 44 where it is amplified. This amplified R.F. signal is fed to the output L-C circuit. The amplified R.F. signals are taken off the inductor 62 at the terminal 64, the terminal 64 being connected to the next stage of a receiver system. As stronger R.F. signals are passed through the system, the positive AGC voltage applied to terminal 66 increases the collector current through transistor 44. The resulting voltage drop across resistor 76 eventually succeeds in turning on transistor 80 which results in current flow through the diode 32. As current flows through the diode 32, the voltage drop across resistor 34 increases to the point where it exceeds the bias voltage applied to terminal 35. This condition results in effectively back-biasing diodes 26 and 28. Therefore, with a strong input R.F. signal condition, the diodes 26 and 28 are turned off and diode 32 turned on, resulting in a maximum attenuation. As can be readily seen, the system operates in such a manner as to keep the R.F. output voltage of the last stage of the receiver system relative constant by causing more or less attenuation to be inserted by the electrically operated continuous attenuator 12.

Additional gain control variation is also provided by the system because the R.F. gain of the reflex amplifier 14 varies with the D.C. control voltage applied to the terminal 66. This additional gain control variation is obtained because the voltage drop which results from the AGC voltage across resistor 76 causes a reduction of the available collector voltage for the transistor 44.

It should be further understood that the foregoing disclosure relates only to preferred embodiments of the invention, and that it is intended to cover all changes and modifications of the examples of the invention herein chosen for the purpose of the disclosure which do not constitute departures from the spirit and scope of the invention.

What is claimed and desired to be secured by Letters Patent is:

1. An automatic gain control system for controlling the level of an R.F. input signal in accordance with a D.C. control voltage comprising:

an attenuator network having an input terminal to which said R.F. input signal is coupled, an output terminal, and an attenuation control terminal;

a reflex amplifier having an R.F. input terminal, a D.C. control voltage input terminal, an R.F. output terminal, and a D.C. output terminal, means coupling said attenuator network output terminal to said R.F. input terminal of said reflex amplifier, and means for applying said D.C. control voltage to said D.C. control voltage input terminal; and an AGC control amplifier having an input terminal and an output terminal, means coupling said D.C. output terminal of said reflex amplifier to said input terminal of said AGC control amplifier, and means coupling said output terminal of said control amplifier to said attenuation control terminal of said attenuator network for varying the attenuation level of said attenuator network, said attenuator network comprising:

a first diode, a second diode, and a third diode, biasing means coupled to the anode of said first diode and the anode of said second diode, means coupling said R.F. input signal to said anode of said first diode, means coupling the anode of said second diode to said R.F. input terminal of said reflex amplifier; and means coupling said anode of said third diode to said output terminal of said control amplifier.

2. An automatic gain control system in accordance with claim 1 wherein said AGC control amplifier comprises:

a transistor having a base, an emitter, and a collector, means coupling said D.C. output terminal of said reflex amplifier to the base of said control amplifier transistor, means coupling the emitter of said control amplifier transistor to a source of reference potential, and means coupling the collector of said control amplifier transistor to said anode of said third diode.

3. An automatic gain control system in accordance with claim 2 wherein said reflex amplifier comprises:

a transistor having a base, emitter, and collector, means coupling the anode of said second diode to the base of said reflex amplifier transistor and an R.F. output L-C circuit comprising an inductor and capacitor connected in parallel, means coupling the collector of said reflex amplifier transistor to one side of said parallel L-C network, and means coupling said R.F. output terminal to said inductor of said L-C network.

References Cited

UNITED STATES PATENTS

| | | | |
|---|---|---|---|
| 2,774,866 | 12/1956 | Burger | 330—29 X |
| 2,971,164 | 2/1961 | Saari | 330—145 |
| 3,111,631 | 11/1963 | Bettinger | 330—133 |
| 3,304,505 | 2/1967 | Pricer | 330—29 X |

ROY LAKE, *Primary Examiner.*

JAMES B. MULLINS, *Assistant Examiner.*

U.S. Cl. X.R.

330—145